United States Patent
Kubo et al.

(10) Patent No.: US 6,740,160 B2
(45) Date of Patent: May 25, 2004

(54) CRYSTAL GROWING APPARATUS

(75) Inventors: Takayuki Kubo, Tokyo (JP); Hiroshi Asano, Tokyo (JP); Fumio Kawahigashi, Tokyo (JP); Akira Tsujino, Tokyo (JP)

(73) Assignee: Sumitomo Mitsubishi Silicon Corporation, Tokyo (JP)

( * ) Notice: Subject to any disclaimer, the term of this patent is extended or adjusted under 35 U.S.C. 154(b) by 0 days.

(21) Appl. No.: 10/105,634

(22) Filed: Mar. 26, 2002

(65) Prior Publication Data

US 2003/0183163 A1 Oct. 2, 2003

(51) Int. Cl.[7] .............................................. C30B 35/00
(52) U.S. Cl. ...................... 117/217; 117/200; 117/208; 117/213; 117/218; 117/222
(58) Field of Search ................................. 117/200, 208, 117/213, 217, 218, 222

(56) References Cited

U.S. PATENT DOCUMENTS 5,951,753 A * 9/1999 Dornberger et al. ........... 117/3
6,117,402 A * 9/2000 Kotooka et al. ......... 422/245.1

\* cited by examiner

Primary Examiner—Felisa Hiteshew
(74) Attorney, Agent, or Firm—Morrison & Foerster LLP

(57) ABSTRACT

In a high rate pulling with a cooler 10 surrounding a single crystal 8, steam explosion by leakage from the cooler 10 is prevented. Flow rates La, Lb of cooling water are measured by flowmeters 14a, 14b on a cooling water inflow side and cooling water outflow side of the cooler 10. When flow rate difference ΔL (La−Lb) determined from the flow rates La, Lb exceeds 20 cc/minute, open/close valves 15a, 15b, 15c are operated to stop water supply to the cooler 10 and drain outward the cooing water in the cooler 10.

6 Claims, 3 Drawing Sheets

CRYSTAL GROWING APPARATUS

BACKGROUND OF THE INVENTION

1. Field of the Invention

The present invention relates to a crystal growing apparatus which is used for manufacturing a single crystal or the like used as a semiconductor material.

2. Description of the Prior Art

There are various methods of manufacturing a silicon single crystal, and a typical one is a Czochralski method (CZ method). In the manufacture of silicon single crystal by the CZ method, as known, a seed crystal is immersed in a silicon melt formed in a quartz crucible, and from this condition, the seed crystal is gradually pulled upward while rotating the crucible and seed crystal to thereby grow the silicon single crystal beneath the seed crystal.

In the pulling of silicon single crystal by such a CZ method, it is known that defect distribution or the like in a crystal section depends on a crystal growing rate, that is, pulling rate. Specifically, the more the pulling rate is increased, the closer to a periphery a ring OSF generating area moves, and is finally eliminated from a crystal effective portion. On the other hand, the less the pulling rate is reduced, the closer to the center of the crystal the ring OSF generating area moves, and finally disappears at the center.

An outside and inside of the OSF generating area are both defect generating areas, but kinds of defects are different between the outside and inside. It is also known that an increased pulling rate surely improves productivity with smaller defects. For this reason, increasing the pulling rate is pursued as one direction of crystal growing.

Installing a heat shield is known as a technique for achieving the increased pulling rate. The heat shield is an inverted frusto-conical tubular heat insulating member provided so as to surround the single crystal, and blocks the melt in the crucible or radiant heat from a heater arranged outside the crucible, thereby facilitating cooling of the single crystal pulled from the melt to achieve the increased pulling rate.

A technique for installing a tubular cooler which is forcedly cooled by water inside a heat shield has been also noted lately (Japanese Patent Laid-Open No. 63-256593, Japanese Patent Laid-Open No. 8-239291, Japanese Patent Laid-Open No. 11-92272, Japanese Patent Laid-Open No. 11-292684). The tubular cooler which is forcedly cooled by water is installed inside the heat shield so as to surround a single crystal, thereby further facilitating cooling of especially hot portions of the single crystal to achieve more increased pulling rate.

In the growing of single crystal by the CZ method, an inside of a furnace is brought into a reduced pressure atmosphere. Also, there is a possibility of damage to various hot zone constituting members including the crucible due to accidental drop or the like of the single crystal.

Among members for achieving the increased pulling rate, damage of the heat shield does not cause very serious problems. However, when the cooler is damaged, there is a possibility of leakage and rapid expansion of cooling water flowing through the cooler in the furnace thereby to induce steam explosion. Even when the cooler is not damaged, there is a possibility of spontaneous leakage of the cooling water due to secular changes or the like.

Crystal growing apparatuses using coolers which have been proposed in the past have serious problems in safety operation since no means for detecting leakage from the cooler are mounted.

BRIEF SUMMARY OF THE INVENTION

The present invention has its object to provide a crystal growing apparatus with a high level of safety which achieves an increased pulling rate by a cooler and prevents serious accidents due to leakage from the cooler.

In order to attain the object, the present invention is directed to a crystal growing apparatus which grows a single crystal from a melt by a CZ method, including: a tubular cooler which is provided so as to surround the single crystal grown from the melt, and is forcedly cooled by cooling water flowing through the cooler to cool the single crystal; and flowmeters which are provided on a cooling water inflow side and a cooling water outflow side of the cooler, and measure flow rates of the cooling water on the respective sides.

In the crystal growing apparatus of the present invention, when no leakage occurs in the cooler, an inflow rate of the cooling water into the cooler coincides with an outflow rate of the cooling water from the cooler. When the leakage occurs in the cooler, the outflow rate from the cooler is reduced compared with the inflow rate into the cooler, and the flow rate difference is detected from outputs of the flowmeters provided on the inflow side and outflow side.

The flow rate difference corresponds to a leakage amount from the cooler. Studies by the inventors of the present invention reveal that slight leakage from the cooler does not have large influence on furnace pressure, and that there is a high possibility that the furnace pressure is rapidly increased when the leakage amount exceeds a predetermined value, specifically 20 cc/second, leading to steam explosion. Therefore, preferable flowmeters are capable of measuring the flow rates under 20 cc/second.

By providing abnormality detecting means which uses a threshold value of the flow rate difference of 20 cc/second and determines abnormal leakage when the flow rate exceeds 20 cc/second, the abnormal leakage only is surely selectively detected.

As a remedy when the abnormal leakage is detected, automatic valves respectively provided on the cooling water inflow side and cooling water outflow side of the cooler are preferably operated by an abnormality detecting signal output from the abnormality detecting means. This permits water supply to the cooler to be automatically stopped when the abnormal leakage occurs, and also permits prompt drain of water from the cooler.

Especially, the drain of water from the cooler can be promptly carried out when the automatic valve on the inflow side is an open/close valve for opening and closing a water supply pipe, and the automatic valve on the outflow side is a switch valve for switching a pipe line from a usual drain pipe to an emergency drain pipe.

The flowmeter is preferably arranged near the cooler, specifically within 3 m along a pipe length of the cooling water in order to reduce influence of pipe resistance or pulses of water flow.

The cooler is made from a metal which is forcedly cooled by passing water. Preferable metal is a copper based metal containing copper with high thermal conductivity as a base. A specific dimension and shape of the cooler is appropriately designed depending on pulling conditions.

The cooler is also preferably combined with a heat shield and arranged therein. Combination with the heat shield facilitates cooling of the crystal, and also more effectively restrains an increase in temperature of the cooler itself to promote an increased pulling rate.

DETAILED DESCRIPTION OF THE PREFERRED EMBODIMENTS

Figure 1:
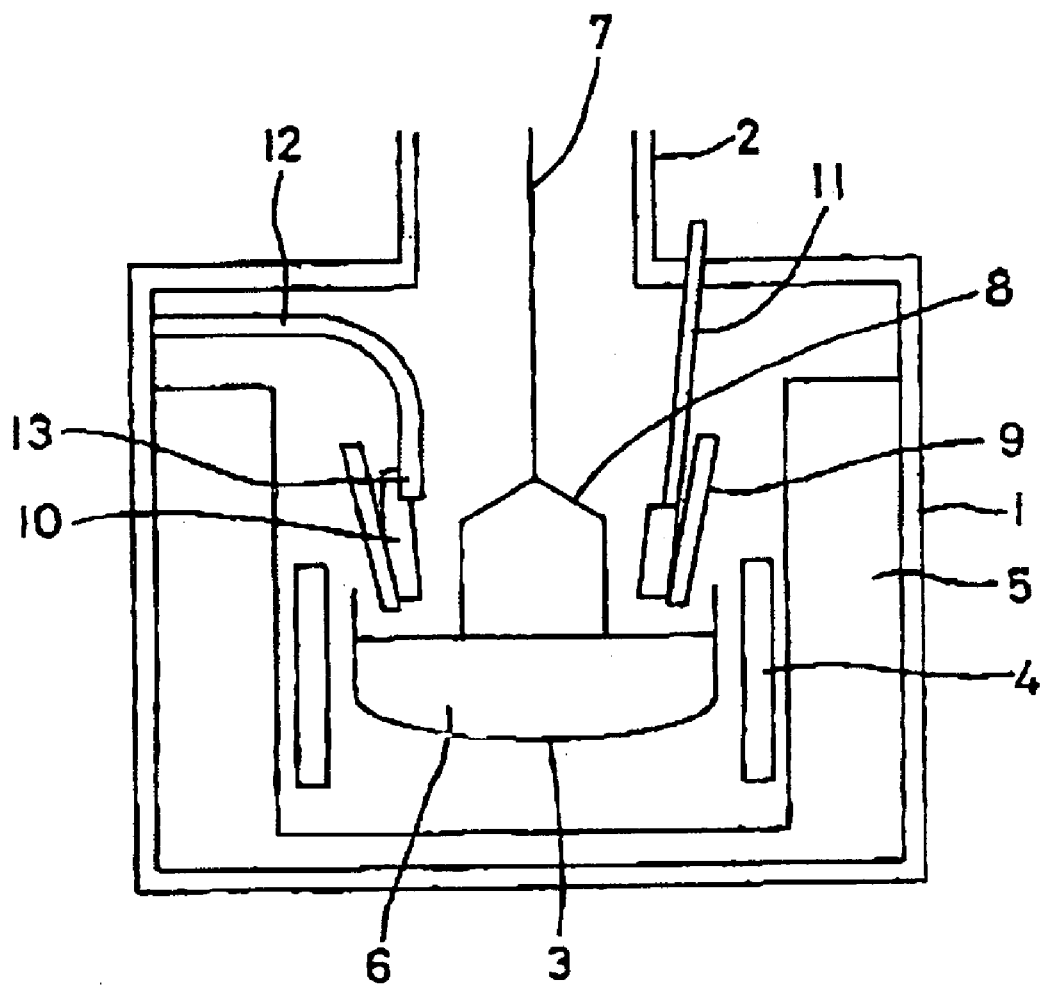
FIG. 1 is a vertical sectional view of a pulling furnace and shows a configuration of an embodiment of a crystal growing apparatus of the present invention.

An embodiment of the invention will be described below in detail with reference to the drawings. FIG. 1 is a vertical sectional view of a pulling furnace and shows a configuration of an embodiment of a crystal growing apparatus of the invention, FIG. 2 is a cross sectional view of the pulling furnace, and FIG. 3 is a schematic diagram of a leakage detecting system.

Figure 2:
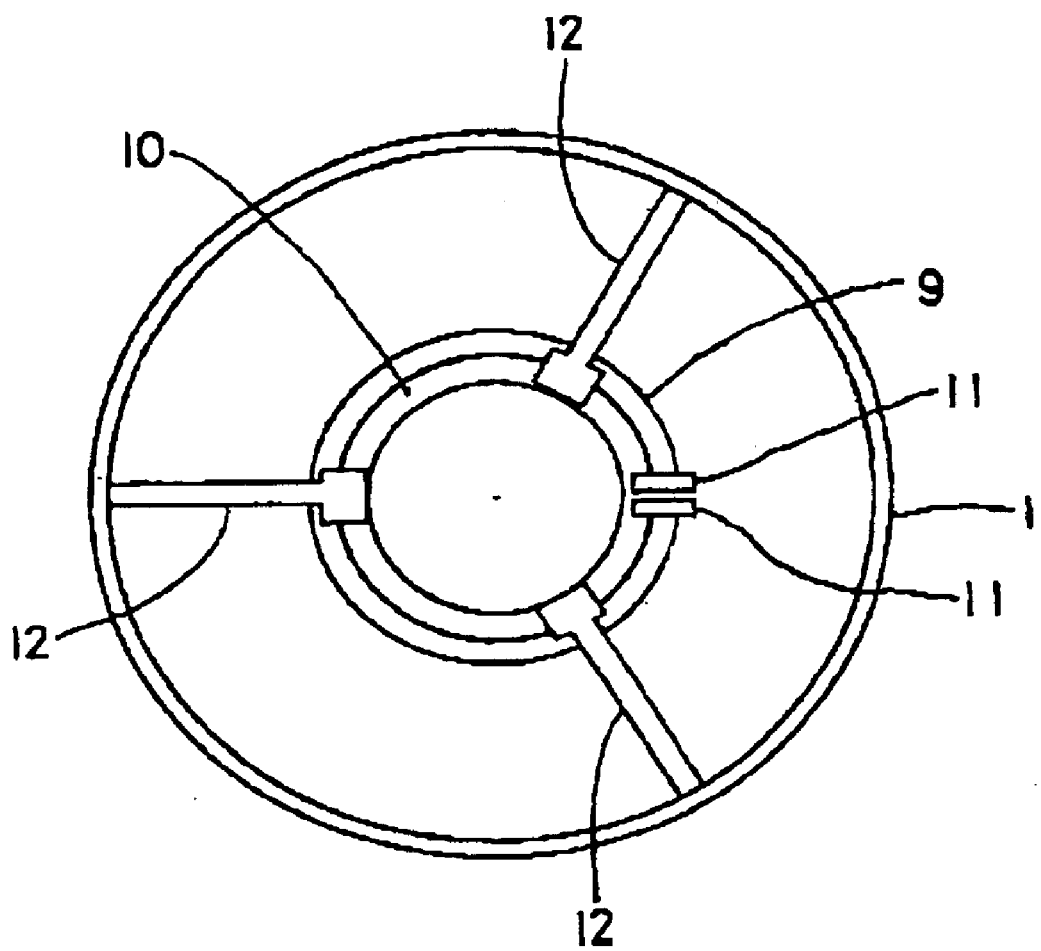
FIG. 2 is a cross sectional view of the pulling furnace.
Figure 3:
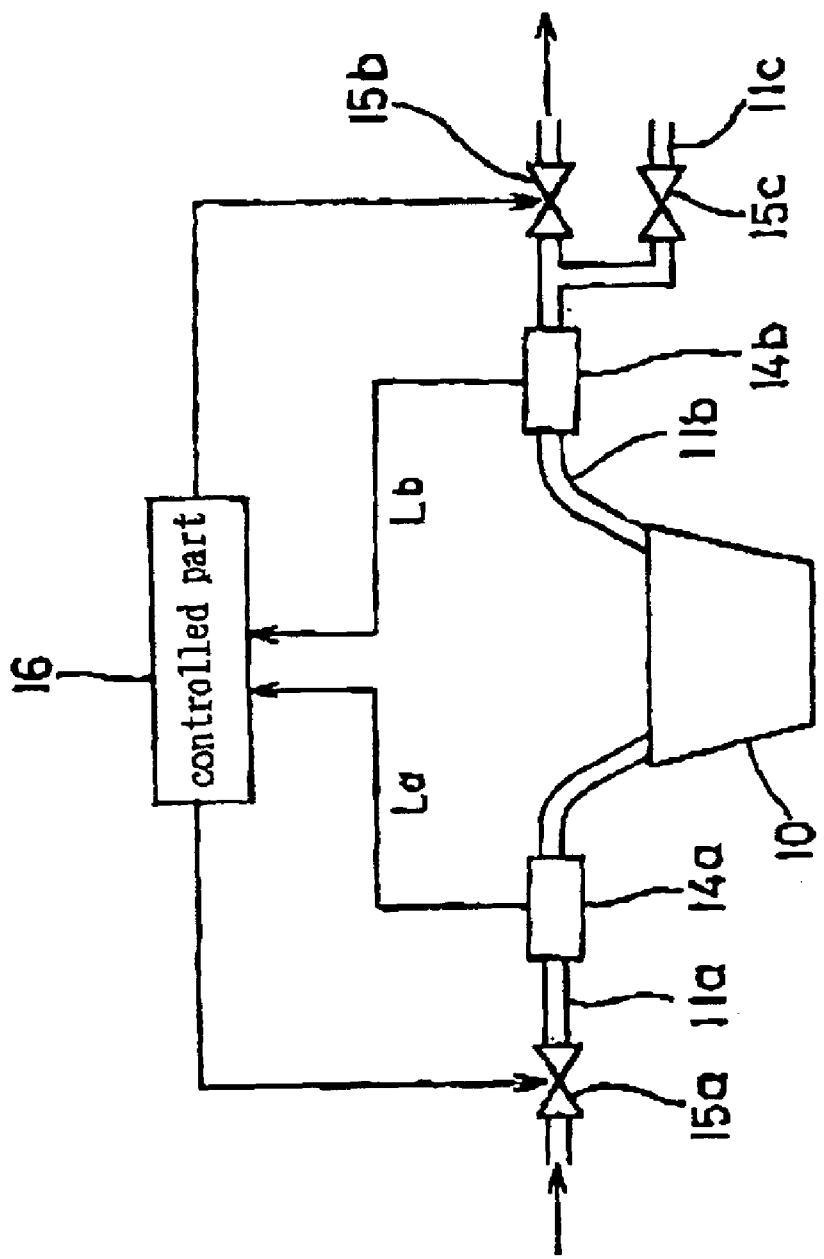
FIG. 3 is a schematic diagram of a leakage detecting system.

As shown in FIGS. 1 and 2, the pulling furnace has a furnace body constituted by a cylindrical main chamber 1 and pull chamber 2. The pull chamber 2 having a smaller diameter and longer length than the main chamber 1 is provided in a standing manner on the center of the main chamber 1.

A crucible 3 is arranged in a center of the main chamber 1. The crucible 3 comprises an inner quartz crucible into which poly-silicon is charged and a support crucible made from graphite fitted outside the quartz crucible. The crucible 3 is rotationally driven, and driven up and down by a support shaft called a pedestal.

A resistance heating type heater 4 is concentrically arranged outside the main chamber 1, and outside the heater 4, a thermal insulating cylinder 5 is arranged along an inner surface of the main chamber 1. The heater 4 melts the poly-silicon charged into the crucible 3 to form a silicon melt 6 in the crucible 3.

On the other hand, above the crucible 3, a wire 7 as a pulling shaft is suspended through the center of the pull chamber 2. The wire 7 is rotationally driven and axially driven up and down by a pulling mechanism provided on an upper portion of the pull chamber 2. A lower end of the wire 7 is mounted with a seed chuck for holding a seed crystal. The seed crystal held by the seed chuck is immersed in the melt 6 in the crucible 3, and the wire 7 is driven so as to gradually raise the seed crystal with rotation thereby to grow a silicon single crystal 8 beneath the seed crystal.

Above the crucible 1, a cylindrical heat shield 9 is concentrically provided near the melt 6 in the crucible 3 so as to surround the single crystal 8. The heat shield 9 is made from graphite and gradually diverges from a lower portion to an upper portion in order to effectively block radiant heat from the melt 6 in the crucible 3 or the heater 4, and the lower portion is inserted in the crucible 3 to be located above the melt 6 in the crucible 3.

A cylindrical cooler 10 is concentrically provided inside the heat shield 9. The cooler 10 is made from a copper based metal with high thermal conductivity, and forcedly cooled by cooling water supplied therein through water passing pipes 11a, 11b similarly made from a copper based metal. The cooler 10 is arranged in a lower portion of the heat shield 9, and surrounds especially hot portions immediately after solidification of the single crystal 8 thereby to facilitate cooling of the hot portions. Similarly to the heat shield 9, the cooler 10 gradually diverges from a lower portion to an upper portion. The water passing pipes 11a, 11b are welded in such a manner that no load is imposed on the cooler 10.

A support member for supporting the cooler 10 in the furnace body herein comprises a plurality of support arms 12 . . . radially arranged around a pulling shaft in the furnace body. The support arms 12 . . . are formed by substantially inverted L-shaped rods which horizontally extend from an inner surface of an upper portion of the main chamber 1 toward the center of the furnace and curve downwardly in midstream. A top edge of the cooler 10 is detachably coupled to respective tips of the plurality of support arms 12 . . . by bolts 13. The support arms 12 are herein made from a stainless steel and forcedly cooled by passing water through a line different from a line for the cooler 10.

As shown in FIG. 3, one of the water passing pipes 11a, 11b is a water supply pipe for supplying the cooling water in the cooler 10, and the other is a drain pipe for draining the cooling water from the cooler 10. The water supply pipe 11a is provided with a flowmeter 14a and an automatic open/close valve 15a. The flowmeter 14a is provided within 3 m along a pipe length from the cooler 10, and the open/close valve 15a is provided on an inflow side of the flowmeter 14a. Similarly, the drain pipe 11b is provided with a flowmeter 14b and an automatic open/close valve 15b. The flowmeter 14b is provided within 3 m along a pipe length from the cooler 10, and the open/close valve 15b is provided on an outflow side of the flowmeter 14b.

The drain pipe 11b is also mounted with a drain pipe 11c used in emergency. The drain pipe 11c branches off between the flowmeter 14b and open/close valve 15b, and is mounted with a dedicated automatic open/close valve 15c.

The automatic open/close valves 15a, 15b, 15c are operated by a controller 16. The controller 16 determines flow rate difference ΔL (La−Lb) from data on flow rates La, Lb measured by the flowmeters 14a, 14b, and compares the flow rate difference ΔL with a threshold value (20 cc/second). Then, the controller 16 switches the open/close valves 15a, 15b from an open condition to an close condition, and switches the open/close valve 15c from a close condition to an open condition when the flow rate difference ΔL exceeds the threshold value (20 cc/second).

The flowmeters 14a, 14b both have sensitivity to measure the flow rates under 20 cc/second, and herein used flowmeters 14a, 14b can measure the flow rates under 5 cc/second.

Next, an example of operation of crystal growing with the pulling furnace will be described.

Into the crucible 3, 100 kg of poly-silicon material is charged, and then an inside of the chamber is brought into an Ar atmosphere of 200 Pa. The poly-silicon material in the crucible 3 is melt by the heater 4 provided outside the crucible 3, and a seed crystal with (100) orientation is used to grow the single crystal 8 with a diameter of 200 mm beneath the seed crystal.

At this time, in order to maintain a fixed liquid level of the melt 6 in the crucible 3, the crucible 3 is gradually raised in accordance with growth of the crystal. Alternatively, the crucible 3 is rotated in a direction identical or opposite to the rotational direction of the single crystal 8.

Among the open/close valves 15a, 15b, 15c, the open/close valves 15a, 15b are generally in open conditions, and the open/close valve 15c is in a close condition. Thus, the cooling water flows through the cooler 10 via the water supply pipe 11a and drain pipe 11b to forcedly cool the cooler 10, thereby forcedly cooling the especially hot portions immediately after solidification of the single crystal 8. This resulted in achievement of the pulling rate of the single crystal 8 of more than 2 mm/minute. A pulling rate achieved when cooler 10 is not used is on the order of 1 mm/minute.

In the operation, the flow rates La, Lb of the cooling water passing through the water supply pipe 11a and drain pipe 11b are measured by the flowmeters 14a, 14b. When leakage occurs in the cooler 10, the leakage amount is detected by the controller 16 as the flow rate difference ΔL (La−Lb). When the flow rate difference ΔL exceeds 20 cc/minute, the open/close valves 15a, 15b are operated to the closing condition, and the open/close valve 15c is operated to the open condition. Thus, water supply to the cooler 10 is stopped, and the cooling water in the cooler 10 is drained outward through the drain pipe 11c, preventing steam explosion by the leakage.

In order to demonstrate that 20 cc/second is effective as the threshold value of the leakage amount for detecting abnormal leakage, water was intentionally leaked in the furnace. The amounts of leakage were set to 5 cc/second, 10 cc/second, 20 cc/second, 30 cc/second and 40 cc/second. Results of studies on variation of furnace pressure in the respective cases are shown in Table 1.

TABLE 1

| FLOW RATE DIFFERENCE: cc | 5 | 10 | 20 | 30 | 40 |
|---|---|---|---|---|---|
| PRESSURE: Pa | 210 | 210 | 215 | 450 | 800 |

The furnace pressure due to the leakage is slightly increased before the leakage amount of 20 cc/second, but is rapidly increased when the leakage amount exceeds 20 cc/second. Therefore, 20 cc/second is preferable as the threshold value of the leakage amount, and preferable flowmeters are capable of measuring the flow rate under 20 cc/second.

Further, the pipe lengths from the flowmeters 14a, 14b to the cooler 10 were changed. Even in the case of no leakage, the pipe lengths of more than 3 m caused malfunctions of the open/close valves 15a, 15b, 15c. Therefore, the flowmeters 14a, 14b are preferably located within 3 m along the pipe lengths to the cooler 10.

As described above, the crystal growing apparatus of the invention measures the flow rates on the cooling water inflow side and cooling water outflow side of the cooler at the time of achieving the increased pulling rate by the cooler, thereby detecting and surely preventing serious accidents due to leakage from the cooler.

What is claimed is:

1. A crystal growing apparatus which grows a single crystal from a melt by a CZ method, comprising:

a tubular cooler which is provided so as to surround the single crystal grown from the melt, and is forcedly cooled by cooling water flowing through the cooler to cool the singled crystal;

flowmeters which are provided on a cooling water inflow side and a cooling water outflow side of said cooler, and measure flow rates of the cooling water on the respective sides; and an abnormality detecting unit which determines a flow rate difference from said flow rates of said cooling water measured on said cooling water inflow side and cooling water outflow side of said cooler, and detects abnormal leakage in said cooler from said flow rate difference.

2. The crystal growing apparatus according to claim 1, wherein said flowmeters are capable of measuring the flow rates under 20 cc/second.

3. The crystal growing apparatus according to claim 2, further comprising automatic valves which are respectively provided on the cooling water inflow side and cooling water outflow side of said cooler, and operated by an abnormality detecting signal output from said abnormality detecting means.

4. The crystal growing apparatus according to claim 3, wherein the automatic valve on the inflow side is an open/close valve for opening and closing a water supply pipe, and the automatic valve on the outflow side is a switch valve for switching a pipe line from a usual drain pipe to an emergency drain pipe.

5. The crystal growing apparatus according to claim 1, further comprising automatic valves which are respectively provided on the cooling water inflow side and cooling water outflow side of said cooler, and operated by an abnormality detecting signal output from said abnormality detecting means.

6. The crystal growing apparatus according to claim 5, wherein the automatic valve on the inflow side is an open/close valve for opening and closing a water supply pipe, and the automatic valve on the outflow side is a switch valve for switching a pipe line from a usual drain pipe to an emergency drain pipe.

* * * * *